United States Patent
Hinata (10) Patent No.: US 10,242,961 B2
(45) Date of Patent: Mar. 26, 2019

(54) SEMICONDUCTOR DEVICE

(71) Applicant: Fuji Electric Co., Ltd., Kanagawa (JP)

(72) Inventor: Yuichiro Hinata, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 14/873,906

(22) Filed: Oct. 2, 2015

(65) Prior Publication Data

US 2016/0126209 A1    May 5, 2016

(30) Foreign Application Priority Data

Nov. 5, 2014  (JP) ................................ 2014-225323

(51) Int. Cl.
| | |
|---|---|
| *H01L 23/00* | (2006.01) |
| *H01L 23/498* | (2006.01) |
| *H01L 23/373* | (2006.01) |

(52) U.S. Cl.
CPC ........ *H01L 24/14* (2013.01); *H01L 23/49811* (2013.01); *H01L 24/01* (2013.01); *H01L 24/10* (2013.01); *H01L 23/3735* (2013.01); *H01L 2924/181* (2013.01)

(58) Field of Classification Search
CPC .......................................... H01L 24/10–24/14
See application file for complete search history.

(56) References Cited

U.S. PATENT DOCUMENTS

| | | | |
|---|---|---|---|
| 6,551,859 B1* | 4/2003 | Lee ..................... | H01L 21/4828 29/827 |
| 7,579,692 B2* | 8/2009 | Matsushima ........... | H01L 24/11 257/737 |
| 8,264,089 B2* | 9/2012 | Alvarado ................ | H01L 24/03 257/777 |
| 8,558,392 B2* | 10/2013 | Chua ..................... | H01L 21/561 257/676 |

(Continued)

FOREIGN PATENT DOCUMENTS

| | | |
|---|---|---|
| JP | S56-78276 U | 6/1981 |
| JP | 2002-76047 A | 3/2002 |

(Continued)

OTHER PUBLICATIONS

Japanese Office Action dated Jul. 3, 2018, in a counterpart Japanese patent application No. 2014-225323. (A machine translation (not reviewed for accuracy) attached.).

*Primary Examiner* — Bac H Au
(74) *Attorney, Agent, or Firm* — Chen Yoshimura LLP (57) ABSTRACT

A semiconductor device includes: an insulating substrate including an insulating plate and a circuit board on the insulating plate; a semiconductor chip having an electrode on a front surface thereof, a back of the semiconductor chip being fixed to the circuit board; a printed circuit board that faces the circuit board and the front surface of the semiconductor chip; and one or more conductive posts each having one end connected via solder to the circuit board or to the electrode on the semiconductor chip, another end connected to the printed circuit board, and one or more grooves that (Continued)

extend from said one end of the conductive post that contacts the solder to said another end of the conductive post connected to the printed circuit board.

4 Claims, 6 Drawing Sheets

(56) References Cited

U.S. PATENT DOCUMENTS

| | | | |
|---|---|---|---|
| 8,741,764 B2* | 6/2014 | Chen | H01L 22/12 |
| | | | 257/E21.508 |
| 8,829,675 B2* | 9/2014 | Ryan | H01L 24/13 |
| | | | 257/623 |
| 2001/0011907 A1* | 8/2001 | Farnworth | G01R 1/0466 |
| | | | 324/762.01 |
| 2002/0033531 A1 | 3/2002 | Matsushima et al. | |
| 2006/0055032 A1* | 3/2006 | Chang | H01L 21/4853 |
| | | | 257/734 |
| 2009/0224391 A1* | 9/2009 | Lin | H01L 21/6835 |
| | | | 257/690 |
| 2013/0020698 A1* | 1/2013 | Hsieh | H01L 24/11 |
| | | | 257/737 |

FOREIGN PATENT DOCUMENTS

| | | |
|---|---|---|
| JP | 2002-280253 A | 9/2002 |
| JP | 2009-64852 A | 3/2009 |
| JP | 2011-119453 A | 6/2011 |
| JP | 2012-212922 A | 11/2012 |

* cited by examiner

SEMICONDUCTOR DEVICE

BACKGROUND OF THE INVENTION

Technical Field

The present invention relates to a semiconductor device.

Background Art

Semiconductor chips made of silicon (Si) are widely used in power semiconductor modules. In recent years, semiconductor chips made from semiconductor materials that have a large band gap have been used in such modules. An example of such a semiconductor material is silicon carbide (SiC).

Bonding wires have been used in wiring members that electrically connect electrodes on the front surface of silicon and silicon carbide semiconductor chips to various components, such as circuit boards in insulating substrates. In recent years, another kind of wiring member has been used instead of bonding wires. These wiring members are formed of a printed circuit board and a plurality of conductive posts, of which one end is connected to the printed circuit board (Patent Document 1).

Wiring members formed of printed circuit boards and conductive posts are very reliable, and power semiconductor modules that utilize such wiring members can be made thinner than modules that use bonding wires. Furthermore, in regards to electrodes on the front surface of semiconductor chips, conductive posts are able to connect to smaller electrodes than bonding wires can. Therefore, wiring members formed of a printed circuit board and conductive posts are well-suited for wiring members used for SiC semiconductor chips, which have smaller surface electrodes than Si semiconductor chips. In addition, since such wiring members are able to pass a large amount of current to the semiconductor chip due to the fact that a plurality of conductive posts are connected to one electrode on the front surface of the chip, such wiring members are well-suited for Si semiconductor chips.

RELATED ART DOCUMENT

Patent Document

Patent Document 1: Japanese Patent Application Laid-Open Publication No. 2009-64852

SUMMARY OF THE INVENTION

One end of a conductive post in a wiring member described above is electrically and mechanically connected to a semiconductor chip via a bonding material such as solder. The solder that is formed on the one end of the conductive post connected to the semiconductor chip spreads out toward the bottom. (A solder with this shape is hereafter referred to as a "fillet.") In instances where a plurality of conductive posts have been provided next to each other on a semiconductor chip, there have been cases when the fillets of neighboring conductive posts have come into contact with each other. When this happens, there is the possibility that the current passing through the semiconductor chip will short-circuit, causing the semiconductor chip to not work properly.

It becomes more likely that the neighboring post electrode fillets will come into contact with each other if too much solder is applied to the surface of the semiconductor chip before the conductive posts are bonded to the semiconductor chip. One solution to this problem that has been considered is to decrease the amount of solder applied to the front surface of the semiconductor chip before bonding. However, it is difficult in industrially-used solder application devices to control the amount of solder used when dealing with quantities of a few tenths of a milligram. As a result, it is difficult to control the amount of solder so that a desired quantity is used.

Accordingly, the present invention is directed to a semiconductor device that substantially obviates one or more of the problems due to limitations and disadvantages of the related art.

An object of the present invention is to provide a semiconductor device that includes a wiring member that is formed of a printed circuit board and conductive posts, in which fillets of neighboring post electrodes are prevented from coming into contact with each other.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, including: an insulating substrate including an insulating plate and a circuit board on the insulating plate; a semiconductor chip having an electrode on a front surface thereof, a back of the semiconductor chip being fixed to the circuit board; a printed circuit board that faces the circuit board and the front surface of the semiconductor chip; and one or more conductive posts each having one end connected via solder to the circuit board or to the electrode on the semiconductor chip, another end connected to the printed circuit board, and one or more grooves that extend from said one end of the conductive post that contacts the solder to said another end of the conductive post connected to the printed circuit board.

According to at least one aspect of this semiconductor device, fillets of neighboring post electrodes can be prevented from coming into contact with each other in a semiconductor device that includes a wiring member formed of a printed circuit board and conductive posts.

It is to be understood that both the foregoing general description and the following detailed description are exemplary and explanatory, and are intended to provide further explanation of the invention as claimed.

DETAILED DESCRIPTION OF EMBODIMENTS

Hereafter, a detailed description of the embodiments of the semiconductor device according to the present invention will be made with reference to the drawings. The phrase "electrically and mechanically connected" appears in this specification. This phrase is not limited to situations in which the objects in question are in direct contact with each other, and includes situations in which the objects are connected via a conductive bonding material such as solder or a metallic sintering material.

(Embodiment 1)

Figure 1:
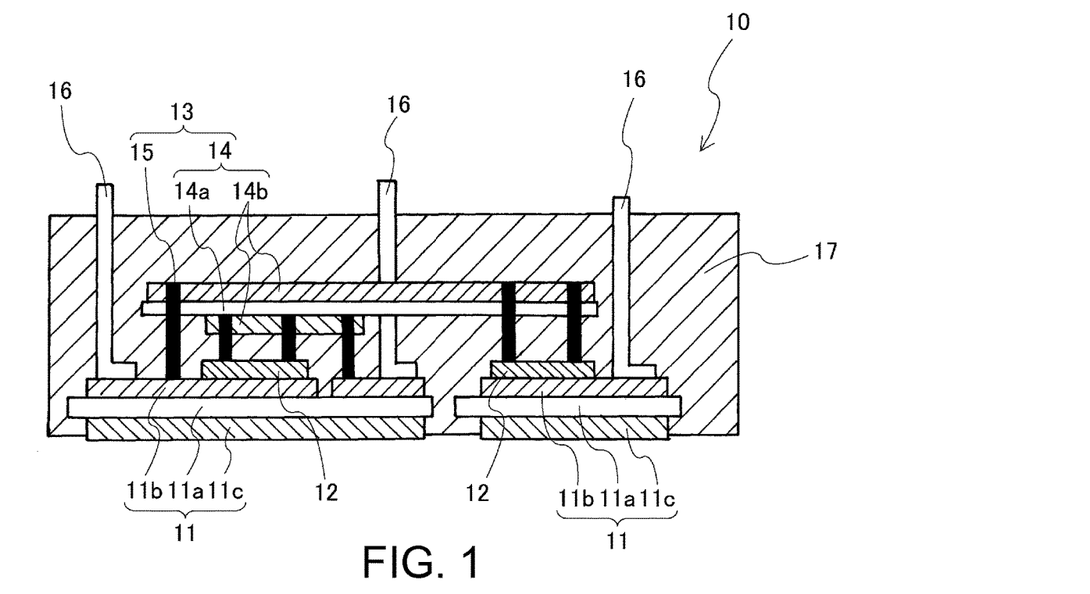
FIG. 1 is a cross section of a power semiconductor module according to an embodiment of the present invention.

FIG. 1 is a schematic cross section of a power semiconductor module 10 in an embodiment of the present invention.

The power semiconductor module 10 has a circuit in which switching elements and freewheel diodes are connected in a reverse parallel connection to form an upper arm and a lower arm, for example. The power semiconductor module 10 includes an insulating substrate 11, a semiconductor chip 12, a printed circuit board 14, and conductive posts 15. The power semiconductor module 10 further includes an external terminal 16 and a sealant 17.

The insulating substrate 11 includes: an insulating plate 11a; a circuit board 11b disposed on the front surface of the insulating plate 11a, or in other words, the principal surface; and a metal plate 11c provided on the back surface of the insulating plate 11a. In other words, the circuit board 11b, the insulating plate 11a, and the metal plate 11c are stacked in that order to form the insulating substrate 11. The insulating plate 11a is formed of an insulating ceramic made of aluminum nitride, silicon nitride, aluminum oxide, or the like, for example, and the circuit board 11b and the metal plate 11c are formed of a metal such as copper, for example. A prescribed circuit pattern is formed on the circuit board 11b. The insulating substrate 11 can use a DCB (direct copper bonding) substrate, an AMB (active metal blazing) substrate, or the like, for example.

The semiconductor chip 12 has an electrode (not shown) on the front surface of the chip. The back surface of the semiconductor chip 12 is fixed to the circuit board 11b via a bonding material (not shown), such as solder. In the present embodiment, the semiconductor chip 12 is a vertical semiconductor chip in which electrodes are disposed respectively on the front surface and the back surface of the semiconductor chip 12. The electrodes on the back surface of the chip 12 are electrically and mechanically connected to the circuit board 11b. However, the semiconductor chip 12 is not limited to a vertical semiconductor chip, and may be a horizontal semiconductor chip in which various types of electrodes are disposed on the front surface of the semiconductor chip 12.

The semiconductor chip 12 is a power MOSFET, a diode, or an IGBT (insulated-gate bipolar transistor), for example. The semiconductor chip 12 may be made of a silicon semiconductor or a silicon carbide (SiC) semiconductor. If the semiconductor chip 12 is an IGBT, the electrodes on the back surface of the chip are collector electrodes, and the electrodes on the front surface of the chip are emitter electrodes and gate electrodes. If the semiconductor chip 12 is a power MOSFET, the electrodes on the back surface of the chip are drain electrodes, and the electrodes on the front surface of the chip are source electrodes and gate electrodes. Semiconductor chips made from silicon carbide (SiC-MOSFET, for example) have a higher breakdown voltage than semiconductor chips made from silicon, and are able to perform switching at high frequencies. The semiconductor chip 12 is not limited to an IGBT or a power MOSFET, and may be one chip or a combination of a plurality of semiconductor chips which can perform switching. Furthermore, the semiconductor chip 12 may be a diode chip such as a FWD (freewheel diode) chip or an SBD (Schottky barrier diode) chip.

The printed circuit board 14 is disposed so as to face the circuit board 11b in the insulating substrate 11 and the electrodes on the front surface of the semiconductor chip 12. The printed circuit board 14 includes an insulating layer 14a, and a metal layer 14b selectively formed to correspond to electric circuits in the semiconductor device. If the semiconductor chip 12 is a switching element, it is preferable that a configuration that has a plurality of metal layers 14b be used. This is done so that the metal layers 14b will correspond to wiring that connects to the gate electrodes and the source electrodes disposed on the front surface of the semiconductor chip 12. The metal layer 14b of the printed circuit board 14 is made from a metal with good conductivity, such as copper. In addition, plating can be applied, as needed, to the front surface of the metal layer 14b of the printed circuit board 14. The insulating layer 14a of the printed circuit board 14 may be a rigid substrate made from a glass epoxy material or the like, a flexible substrate made from a polyimide material or the like, or a substrate made from a ceramic material.

One end of the conductive posts 15 is electrically and mechanically connected, via the solder, to either the electrodes on the front surface of the semiconductor chip 12 or the circuit board 11b in the insulating substrate 11. The other end of the conductive posts 15 is electrically and mechanically connected to the metal layer 14b of the printed circuit board 14 via solder, brazing, or caulking. The conductive posts 15 can be shaped like a column, a cuboid, or the like, but are not limited to these shapes. The bottom surface of the conductive posts 15 is smaller than the electrodes on the front surface of the semiconductor chip 12. Furthermore, the number of conductive posts 15 used to connect to one semiconductor chip 12 can be designed to be any number. For example, a plurality of conductive posts 15 may be bonded to one electrode on the front surface of the semiconductor chip 12. The conductive posts 15 are made from a metal with good conductivity, such as copper. Plating can also be applied, as needed, to the front surface of the conductive posts 15.

Grooves are formed on the sides of the conductive posts 15. These grooves are a characterizing feature of the present embodiment, and will be explained in more detail later using FIG. 2.

The circuit board 11b and the electrodes on the front surface of the semiconductor chip 12, for example, are electrically connected via the wiring member 13, which contains the printed circuit board 14 and the conductive posts 15. This allows for the creation of a power semiconductor module 10 which has high reliability during thermal cycles that are the result of heat that is repeatedly generated by the semiconductor chip 12. In addition, the power semiconductor module 10 can be made thinner when such a wiring member is used instead of bonding wires. Additionally, the conductive posts 15 can be reliably connected to smaller electrodes on the front surface of the semiconductor chip 12 compared to bonding wires. A configuration that uses conductive posts is also more reliable than a configuration in which leads are used since there is less stress on the semiconductor chip 12. This allows for the bonding material, such as solder, to be thinner, which promotes better electrical conductivity and heat conductivity.

The printed circuit board 14 and the conductive posts 15 can be integrated to form the wiring member 13 prior to assembly of the power semiconductor module 10. Using such a wiring member 13 that has been integrated prior to assembly simplifies the manufacturing process of the power semiconductor module 10 compared to instances in which bonding wires are used.

The circuit board 11b in the insulating substrate 11 is electrically and mechanically connected to one end of the external terminal 16. A lead made of a metal plate or the like can be applied to the external terminal 16. A bonding material (not shown) such as solder, ultrasonic bonding, or the like can be used to connect the circuit board 11b and the external terminal 16.

A sealant 17 made from an insulating thermosetting resin seals the respective members of the power semiconductor module 10, which include the insulating substrate 11, the semiconductor chip 12, the wiring member 13, and the external terminal 16. The bottom surface of the metal plate 11c in the insulating substrate 11 and the other end of the external terminal 16 protrude to the exterior of the sealant 17. A sealant made from a thermosetting resin is more resistant to heat and pressure than a sealant formed of a gel. Therefore, it is preferable to use a sealant formed of a thermosetting resin as the sealant 17. Specifically, the sealant 17 can be made using an epoxy resin. In order to increase the ability of the sealant 17 to release heat, it is preferable to use a sealant in which a filler material that has high heat conductivity has been added to the resin. Alumina, boron nitride, and the like can be used as the filler material, for example.

The external shape of the power semiconductor module 10 is determined by the shape of the mold of the sealant 17. In the present embodiment, the sealant 17 forms the housing of the power semiconductor module 10, and a separate case is not included. Transfer molding can be used to form the shape of the mold, but other methods may be used to form the mold as well. Resin potting can also be used to form the shape of the mold, for example. The power semiconductor module 10 also may be configured so as to include a separate case.

Figure 2:
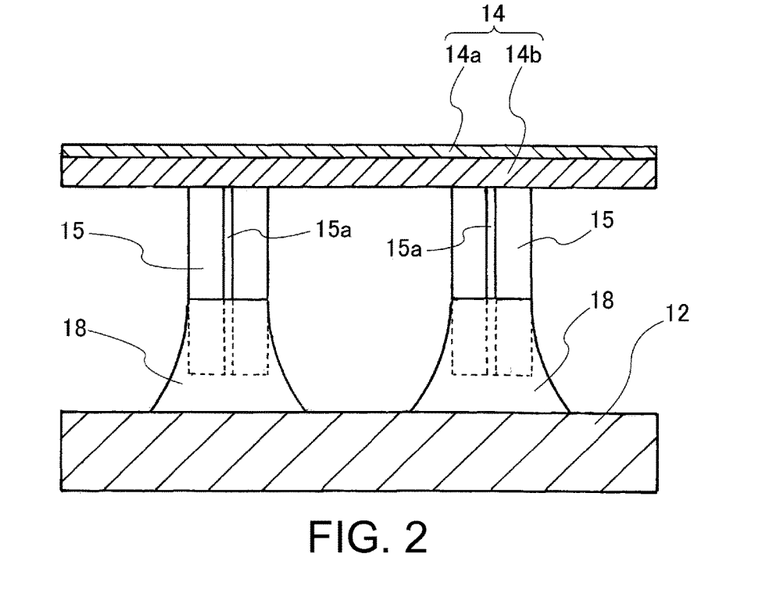
FIG. 2 is an enlarged view of an area near a wiring member and a semiconductor chip shown in FIG. 1.

FIG. 2 illustrates an enlarged schematic view of an area around the semiconductor chip 12 and the wiring member 13. The conductive posts 15 are bonded to the electrodes on the semiconductor chip 12 via solder 18. The solder 18 contacts the bottom surface and the sides of the conductive posts 15 at one end of the conductive posts 15, forming the fillets.

Grooves 15a are formed on the sides of the conductive posts 15, and extend from the end of the conductive posts 15 that contacts the solder 18 to the end of the conductive posts 15 that contacts the printed circuit board 14.

The process for bonding the semiconductor chip 12 and the conductive posts 15 will be described next. First, a paste-like solder is applied to the semiconductor chip 12. Next, one end of the conductive posts 15 is mounted on or brought in close proximity to the solder. The solder is then heated and melted. When the solder melts, the solder, via capillary action, is drawn upward along the side of the conductive posts 15 via the grooves 15a. Therefore, in the present embodiment, the fillets that contact the semiconductor chip can be prevented from spreading outward. As a result, the fillets of neighboring conductive posts 15 can be prevented from coming into contact with each other. In addition, in the present embodiment, the grooves 15a increase the contact area between the conductive posts 15 and the solder 18, which can enhance bonding strength and improve reliability.

Figure 3A:
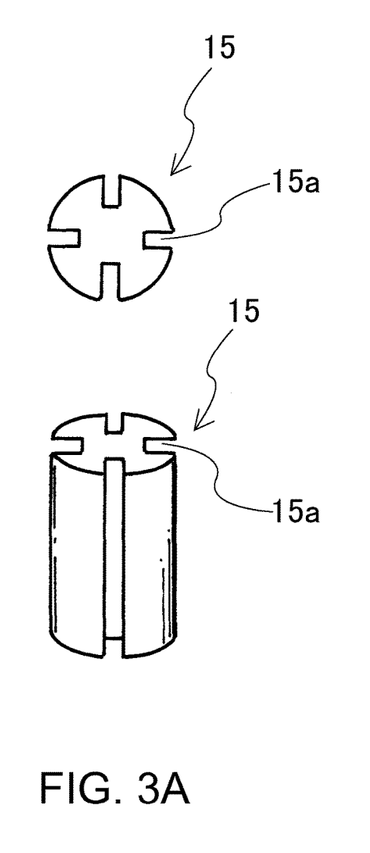
FIG. 3A shows both a plan view and a perspective view of a conductive post shown in FIG. 2.
Figure 3B:
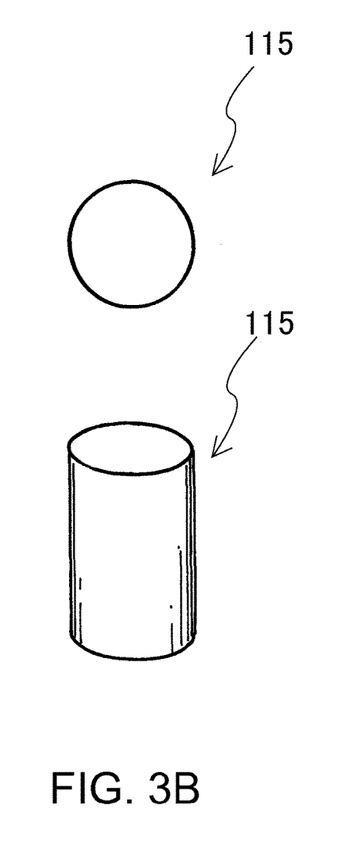
FIG. 3B shows both a plan view and a perspective view of a conductive post shown in FIG. 2.

FIG. 3A shows a plan view and a perspective view of a conductive post 15 shown in FIG. 2. For comparison, FIG. 3B shows a conductive post 115 without grooves. The conductive post 15 shown in FIG. 3A is an example in which straight grooves 15a are disposed, at equal distance from each other, at four places on the sides of the conductive post 15. The conductive post 15 is cylindrically-shaped, and the grooves 15a extend from one end of the conductive post 15 to the other end of the conductive post 15. The width and depth of the grooves 15a are set at values such that it is possible for the solder fillets to be drawn up along the conductive posts 15 via capillary action. The grooves can be formed by stamping, for example. It is preferable that the outer diameter of the conductive posts 15 be uniform from the end that is connected to the semiconductor chip 12 to the other end that is connected to the printed circuit board 14. This is due to the fact that such a structure decreases production costs.

The conductive posts 15 according to the present embodiment are not limited to the examples shown in FIG. 3A. Modification examples of the conductive posts 15 are shown in FIGS. 4A to 4E and FIGS. 5A to 5C.

Figures 4A, 4B, 4C:
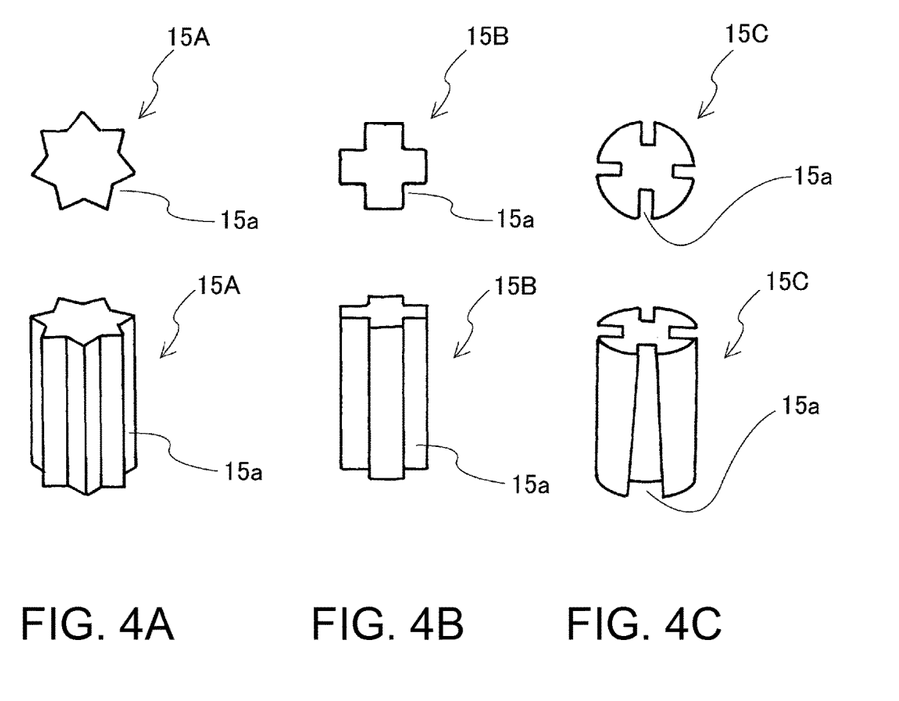
FIG. 4A shows both a plan view and a perspective view of an example of a conductive post.
FIG. 4B shows both a plan view and a perspective view of an example of a conductive post.
FIG. 4C shows both a plan view and a perspective view of an example of a conductive post.

The conductive post 15A shown in FIG. 4A is an example in which seven grooves 15a are provided along the side of the conductive post. As can be seen from the conductive post 15A, there is no limit to the number of grooves 15a that may be used. The number of grooves 15a may be any number greater than or equal to 1.

The conductive post 15B shown in FIG. 4B has a pillar-like shape along which four grooves 15a are provided. The conductive post 15B also has a substantially cross-like shape when viewed in cross-section. As can be seen from the conductive post 15B, the shape of the conductive post need not be cylindrical, and may instead be pillar-like.

The conductive post 15C shown in FIG. 4C is an example in which the width of the grooves 15a varies along the axial direction of the conductive post. The grooves are wider toward the end of the conductive post that contacts the solder 18, and narrower toward the end of the conductive post that contacts the printed circuit board 14. As a result of the grooves 15a being wider toward the solder 18 end of the conductive post, the melted solder can be easily guided along the grooves 15a. Furthermore, since the grooves 15a narrow toward the printed circuit board, it is easier for capillary action to occur in the grooves 15a. As a result of these circumstances, the fillets are effectively prevented from spreading outwards.

Figure 4D:
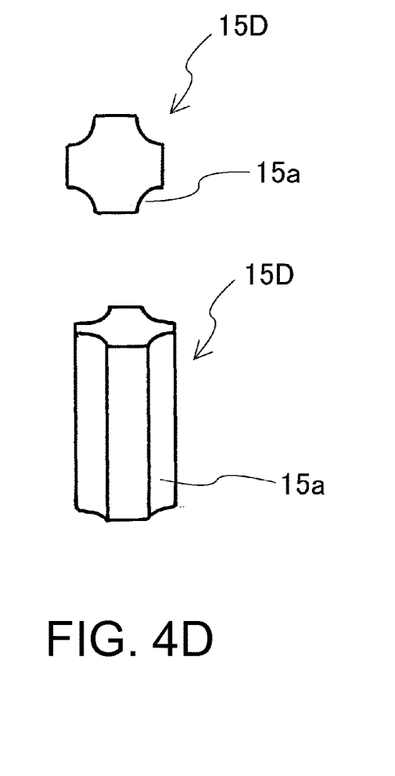
FIG. 4D shows both a plan view and a perspective view of an example of a conductive post.

The conductive post 15D shown in FIG. 4D is an example in which four grooves that have an arc-like shape when viewed in cross-section are provided on the side of a pillar-like conductive post. As can be seen from the conductive post 15D, the shape of the grooves 15a, when viewed at cross-section, is not limited to a polygon shape and may also be an arc-like shape.

Figure 4E:
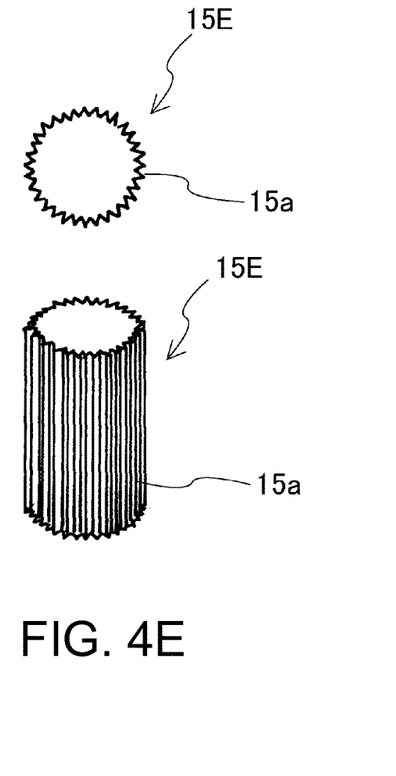
FIG. 4E shows both a plan view and a perspective view of an example of a conductive post.

The conductive post 15E shown in FIG. 4E is an example in which multiple grooves 15a are provided throughout the entire circumference of a cylindrical conductive post.

Figure 5A:
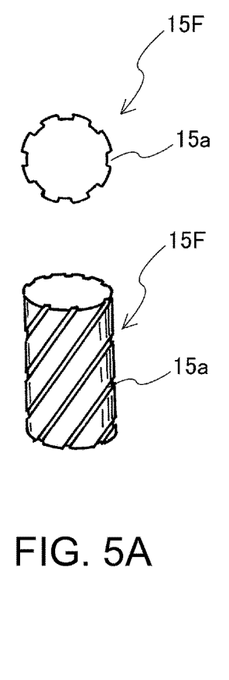
FIG. 5A shows both a plan view and a perspective view of an example of a conductive post.

The conductive post 15F shown in FIG. 5A is an example in which grooves 15a that have a spiral shape are provided on the side of the conductive post. In other words, the grooves 15a are inclined with respect to a direction that is parallel to the axial direction of the conductive post 15F. It is preferable that the inclination angle of the grooves 15a, or in other words, the angle of the grooves 15a with respect to a direction that is parallel to the axial direction of the conductive post 15F, be less than or equal to 45° so as to promote capillary action in which the solder is drawn up the side of the conductive post 15F. As can be seen from the conductive post 15F, the direction in which the grooves extend is not limited to a direction that is parallel to the axial direction of the conductive post. In other words, the direction in which the grooves extend is not limited to that of a straight line extending from end to end of the conductive post. The grooves may be inclined with respect to a direction that is parallel to the axial direction of the conductive post.

Figure 5B:
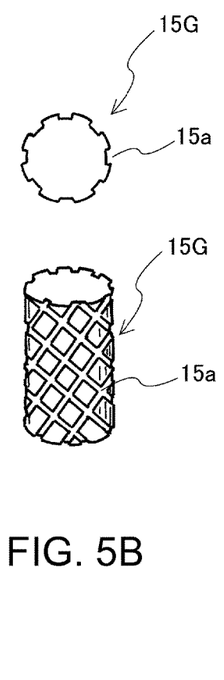
FIG. 5B shows both a plan view and a perspective view of an example of a conductive post.

The conductive post 15G shown in FIG. 5B is an example in which there are a plurality of grooves 15a with different angles of inclination. As can be seen from the conductive post 15G, a plurality of grooves with differing angles of inclination can be provided along the side of the conductive post.

Figure 5C:
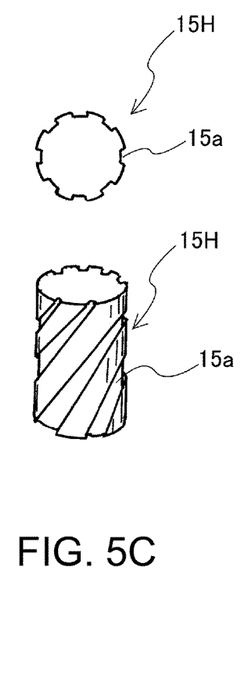
FIG. 5C shows both a plan view and a perspective view of an example of a conductive post.

The conductive post 15H shown in FIG. 5C is an example in which the grooves 15a are inclined with respect to a direction that is parallel to the axial direction of the conductive post, and the grooves 15a are wider toward the end of the conductive post that contacts the solder 18 and narrower toward the end of the conductive post that contacts the printed circuit board. As can be seen from the conductive post 15H, even if the grooves 15a have a spiral shape, it is still possible to use a configuration in which the width of the grooves 15a decreases toward the printed circuit board.

(Embodiment 2)

Figure 6:
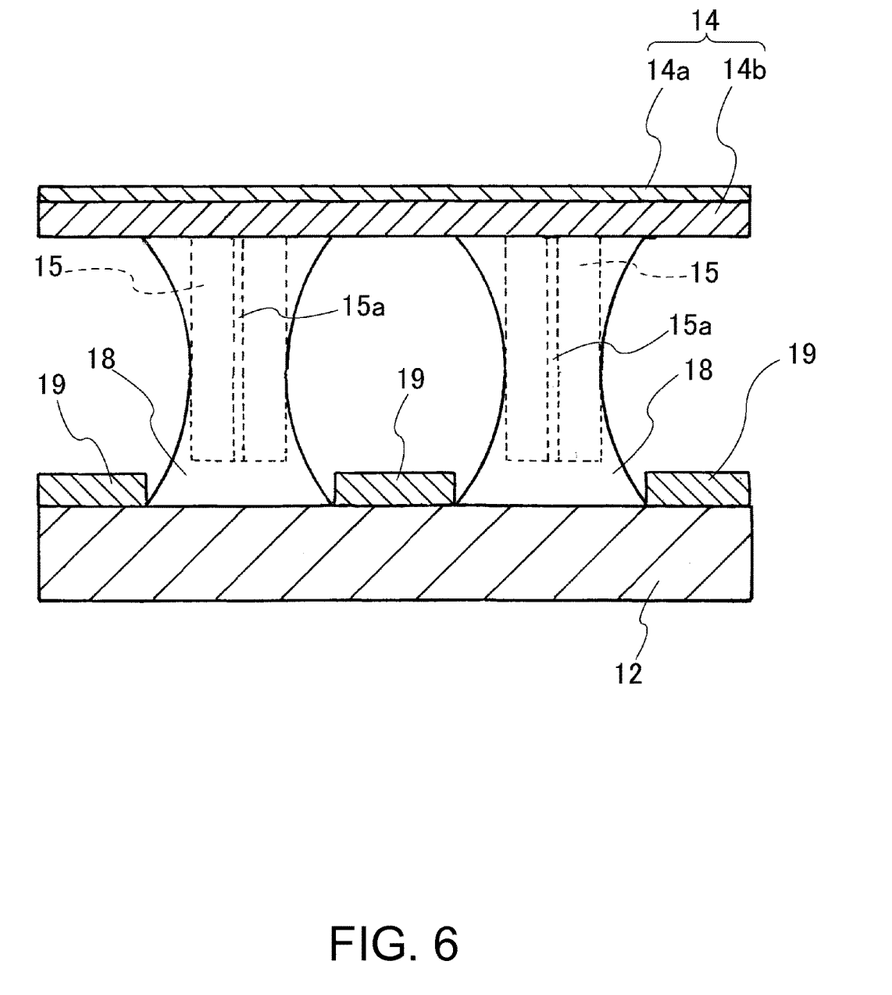
FIG. 6 is an enlarged view of an area near a wiring member and a semiconductor chip in a different embodiment.

Next, a power semiconductor module according to Embodiment 2 will be explained. FIG. 6 is an enlarged schematic view that shows an area around a semiconductor chip 12 and a wiring member 13. FIG. 6 corresponds to FIG. 2 of Embodiment 1, which was explained above. In FIG. 6, members that are identical to members shown in FIG. 2 will have the same reference character as those in FIG. 2. Therefore, a description of members that were described above using FIG. 2 will not be repeated here.

In FIG. 6, a solder resist 19 is provided between neighboring conductive posts 15 on a surface of a semiconductor chip 12. Due to the solder resist 19, a solder 18 is more effectively drawn up the side of the conductive posts 15, and the solder 18 reaches points at which a printed circuit board 14 and the conductive posts 15 are bonded.

The present embodiment can more effectively prevent fillets of neighboring conductive posts 15 from coming into contact with each other. This is due to the fact that the present embodiment includes both grooves 15a and the solder resist 19.

In FIGS. 2 and 6, the conductive posts 15 do not protrude from the printed circuit board 14. The conductive posts 15 may protrude from the printed circuit board 14, however.

A power semiconductor module was explained in detail above using the drawings and the embodiments. However, this power semiconductor module is not limited to the embodiments and the drawings. Various modifications that do not depart from the scope of the present invention are possible.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
    an insulating substrate including an insulating plate and a circuit board on the insulating plate;
    a semiconductor chip having an electrode on a front surface thereof, a back of said semiconductor chip being fixed to said circuit board;
    a printed circuit board that faces said circuit board and the front surface of said semiconductor chip; and
    one or more conductive posts each having one end connected via solder to the front surface of said semiconductor chip, another end bonded to said printed circuit board, and one or more grooves that extend from said one end of the conductive post that contacts the solder to said another end of the conductive post bonded to said printed circuit board,
    wherein a solder resist is provided between adjacent conductive posts on the front surface of said semiconductor chip,
    wherein in each of said one or more conductive posts, the solder reaches a point at which the conductive post is bonded to said printed circuit board so as to cover entire surfaces of the conductive post from said one end contacting the solder to said another end bonded to said printed circuit board,
    wherein, in each of said one or more conductive posts, each groove extends in a direction that is inclined relative to a direction parallel to an axial direction of the conductive post, and an inclination angle between the direction in which each groove extends and the direction parallel to the axial direction of the conductive post is not zero and is 45° or less, and
    wherein each of said one or more conductive posts has said grooves in a plurality, and further has another set of grooves having a different angle of inclination relative to the direction parallel to the axial direction of the conductive post from said groove.

2. The semiconductor device according to claim 1, wherein each of said one or more conductive posts is connected via solder to the electrode on the semiconductor chip.

3. The semiconductor device according to claim 1, wherein a width of each groove decreases toward said printed circuit board.

4. The semiconductor device according to claim 1, wherein, in each of said one or more conductive posts, an outer diameter of the conductive post is uniform from said one end of the conductive post connected to the electrode on the semiconductor chip or the circuit board to said another end of the conductive post connected to the printed circuit board.

* * * * *